US009845190B2

(12) United States Patent
Popescu

(10) Patent No.: US 9,845,190 B2
(45) Date of Patent: Dec. 19, 2017

(54) ASSEMBLY FOR THERMAL INSULATION OF A MAGNET IN A MAGNETIC RESONANCE APPARATUS

(71) Applicant: Siemens Aktiengesellschaft, Munich (DE)

(72) Inventor: Stefan Popescu, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 472 days.

(21) Appl. No.: 14/494,832

(22) Filed: Sep. 24, 2014

(65) Prior Publication Data

US 2015/0082813 A1   Mar. 26, 2015

(30) Foreign Application Priority Data

Sep. 24, 2013   (DE) .................. 10 2013 219 169

(51) Int. Cl.
| | |
|---|---|
| *F25D 11/00* | (2006.01) |
| *B65D 88/74* | (2006.01) |
| *B65D 88/12* | (2006.01) |
| *F25D 19/00* | (2006.01) |
| *F25D 25/00* | (2006.01) |
| *G01R 33/38* | (2006.01) |
| *G01R 33/3815* | (2006.01) |

(52) U.S. Cl.
CPC ........... *B65D 88/74* (2013.01); *B65D 88/126* (2013.01); *F25D 11/003* (2013.01); *F25D 19/003* (2013.01); *F25D 19/006* (2013.01); *F25D 25/005* (2013.01); *G01R 33/3802* (2013.01); *G01R 33/3804* (2013.01); *F25D 2400/32* (2013.01); *G01R 33/3815* (2013.01)

(58) Field of Classification Search
CPC ............................. F25D 11/003; F25D 11/006
See application file for complete search history.

(56) References Cited

U.S. PATENT DOCUMENTS

| | | |
|---|---|---|
| 4,492,090 A | 1/1985 | Laskaris |
| 7,170,377 B2 | 1/2007 | Jiang et al. |
| 2010/0041976 A1 | 2/2010 | Gore et al. |
| 2012/0306492 A1 | 12/2012 | Stautner et al. |
| 2012/0309630 A1 | 12/2012 | Stautner et al. |

*Primary Examiner* — Frantz Jules
*Assistant Examiner* — Brian King
(74) *Attorney, Agent, or Firm* — Schiff Hardin LLP

(57) ABSTRACT

An assembly for thermal insulation of an MR magnet system during such a transport has a container for accommodating an MR magnet, the container being equipped with thermal insulation, and the container has an opening for accommodating a cooling unit. The assembly further has a protective cap, such that the opening is sealed in a reversible manner by the protective cap, and the protective cap is likewise equipped with thermal insulation.

14 Claims, 4 Drawing Sheets

ASSEMBLY FOR THERMAL INSULATION OF A MAGNET IN A MAGNETIC RESONANCE APPARATUS

BACKGROUND OF THE INVENTION

Field of the Invention

The invention relates to an assembly for thermal insulation of a magnet in a magnetic resonance (MR) apparatus, in particular for thermal insulation at times during which the MR magnet is not used for MR tomography, e.g. during transportation thereof.

Description of the Prior Art

MR magnets in MR tomography apparatuses are typically designed as superconducting coil magnets. These are cooled by a coolant, typically helium, to superconducting temperatures. The coolant must be continuously cooled during operation, for which an electrically powered cooling unit (referred to as a "coldhead") is provided.

MR tomography apparatuses can be transported to the target location with MR magnets that have not been cooled, and then first cooled to superconducting temperatures on site. Due to the time and the special equipment required for this, such on-site ramping up is complex and disadvantageous for the operator at the target location. For this reason, MR tomography apparatuses are often transported to the target location with MR magnets therein that are already cooled to superconducting temperatures.

If MR magnets are transported in an already-cooled state, a problem arises due to the cooling unit not operating during the transport. For this reason, it is impossible to prevent heating of the coolant during the transportation. Typical coolants (typically helium) vaporize during this heating, so that, depending on the extent of the heating, a more or less high loss of coolant occurs as a result of vaporization. The coolant losses can amount to as much as 50 liters/day.

The coolant reserve in an MR tomography apparatus is typically in the range of 1,200 liters. In order to prevent a complete evaporation of the coolant reserve, the transportation and installation at the target destination therefore must be completed within a maximum time period that must be strictly adhered to. Furthermore, the evaporated coolant must be replaced at the target destination, which results in additional logistical expenditures. Moreover, coolant, in particular helium, is relatively expensive, and thus a loss of coolant represents financial losses. For this reason, a reduction in the heating, and the thus resulting coolant losses, is desirable during such transport.

A cooling assembly having a cryostat is known from U.S. 2010/0041976 A1, in which inner and outer vacuum chambers are provided for the thermal insulation. The cryostat represents a heat bridge between the cooled interior and the environment. A ventilation structure enables the escape of vaporized coolant but the vaporized coolant is conducted by the ventilation structure such that the vessels and foils that are to be insulated are cooled by this vaporized coolant. By cooling the insulating structures, the thermal conductivity is reduced.

From U.S. 2012/0306492 A1 and U.S. 2012/0309630 A1, further assemblies are known for thermal insulation of cryostats. The assemblies are each based on a double-walled MR magnet container construction. The outer wall has an extended effective length for the thermal insulation. The inner wall is designed as a telescopic mechanism.

An MR tomography apparatus having superconducting magnets is known from U.S. Pat. No. 7,170,377 B2, with which reduced coolant losses occur. Vaporized coolant, normally helium, is cooled by a cooling unit, and re-condensed. The re-condensed coolant is returned to the cryostat. The cryostat is insulated by a radiation thermal shield and an additional super-insulating foil that acts against heating. The cooling unit, or the cryostat opening, in which it is disposed, is not likewise doubly insulated in its entirety, and therefore represents a relatively large heat bridge between the cooled interior and the environment.

SUMMARY OF THE INVENTION

An object of the invention is to improve the thermal insulation for an MR magnet system. In particular, the thermal insulation is to be improved at times during which the MR magnet system is not in operation, e.g. during transportation.

This object is achieved in accordance with the invention by an assembly for thermal insulation of an MR magnet, having a container for accommodating an MR magnet, wherein the container is equipped with thermal insulation that insulates the interior of the container from its exterior environment, and wherein the container has an opening for receiving a cooling unit, and wherein the assembly furthermore has a protective cap that seals the opening in a manner that can be reversed, i.e. the degree of sealing can be lessened so as to depart from a complete seal by the protective cap, and the protective cap is likewise equipped with thermal insulation.

In an embodiment, the protective cap is placed in position without the cooling unit disposed in the opening. In this manner, particularly with large or impractically formed cooling units, e.g. those that extend outwardly to a large degree, an improved thermal insulation can be obtained, while simultaneously keeping the dimensions of the assembly small. The small dimensions are advantageous for the transportation of the assembly, for example.

In a further embodiment, the protective cap is placed on top of the cooling unit. In this manner, a particularly simple thermal insulation of the assembly is obtained, because the protective cap need only be placed in position, without having to remove and reinstall functional elements of the MR magnet system, in particular the cooling unit.

In another embodiment, the protective cap is placed over an intermediate sealing agent, which seals the space enclosed between the protective cap and the container against the environment outside of the assembly. The sealing agent also serves to reduce the transfer of heat from the external environment. In a particularly advantageous manner, the sealing agent enables the evacuation of the space enclosed between the protective cap and the container, by means of which, due to the low thermal conductivity of a vacuum, a particularly effective thermal insulation is obtained.

In a further embodiment, a venting opening is provided, which is connected by a pressure valve to a cooling system disposed in the interior of the container. The cooling system is the device for cooling by a coolant, typically by liquid helium. The venting opening allows a discharge of coolant gas, which is necessary for preventing a buildup of pressure within the assembly. The pressure valve limits the possible coolant pressure within the assembly thereby to a predefined maximal threshold value, above which it opens and allows coolant gas to escape through the venting opening.

In another embodiment, the venting opening is open in the space enclosed between the protective cap and the container. As a result, excess coolant gas does not escape into the environment, and contribute, due to its low temperature in relation to the temperature in the environment, to cooling of the protective cap and the components disposed therein, and thus connected thereto. As a result, the temperature gradient in the assembly components, which are in thermal contact with the interior of the container, is advantageously reduced, and thus the heat input is limited. Furthermore, these components can be made substantially of materials that have a thermal conductivity that decreases at reduced temperatures, such that the heat input is further reduced as a result. Both effects thus increase the thermal insulation of the assembly.

In a further embodiment, the protective cap and the container are designed such that coolant escaping through the venting opening in a gaseous state is able to escape at a reduced flow rate from the space enclosed between the protective cap and the container into the environment outside the assembly. As a result, the possible coolant gas pressure under the protective cap is limited in an advantageous manner, while at the same time a certain dwell time of the coolant gas under the protective cap remains ensured. In particular, by a sealing device designed in this manner, the necessity for an additional pressure valve between the environment and the space within the protective cap is eliminated.

As noted above, a seal is disposed between the protective cap and the container. In a further embodiment, this seal is designed such that coolant in the gaseous state is able to flow at a predefined flow rate through the seal. The flow rate is controlled in a suitable manner thereby, potentially in connection with the seal compacting pressure produced by the cap, with which the seal is compressed between the protective cap and the seal, with respect to the dwell time and the maximum pressure of the coolant gas beneath the protective cap.

In a further embodiment, the thermal insulation of the protective cap is formed as a vacuum insulation and/or as a multi-layered insulating foil. Thermal insulation thus is also provided for embodiments in which the space between the protective cap and the container is not evacuated for the purpose of thermal insulation.

In another embodiment, the venting opening is opened to the environment outside the assembly, and is connected by a venting pipe with the cooling system disposed in the interior of the container. Necessary venting is thereby provided for the excess coolant gas resulting from heating. At the same time, the pipe can be relatively small, in comparison to the quench pipes necessary for the operation of an MR tomography apparatus, i.e. they can exhibit a small cross-section, because only relatively small quantities of coolant gas need to be able to escape. As a result of the small size, a low thermal conductivity of the venting pipes, in particular in comparison with quench pipes, is ensured.

In another embodiment, the venting pipes are made of a material having a thermal conductivity that is equal to or lower than that of aluminum.

In another embodiment, a vacuum is generated in the space enclosed between the protective cap and the container. A particularly effective thermal insulation is thereby ensured, due to the low thermal conductivity of such a vacuum.

DESCRIPTION OF THE PREFERRED EMBODIMENTS

Figure 1:
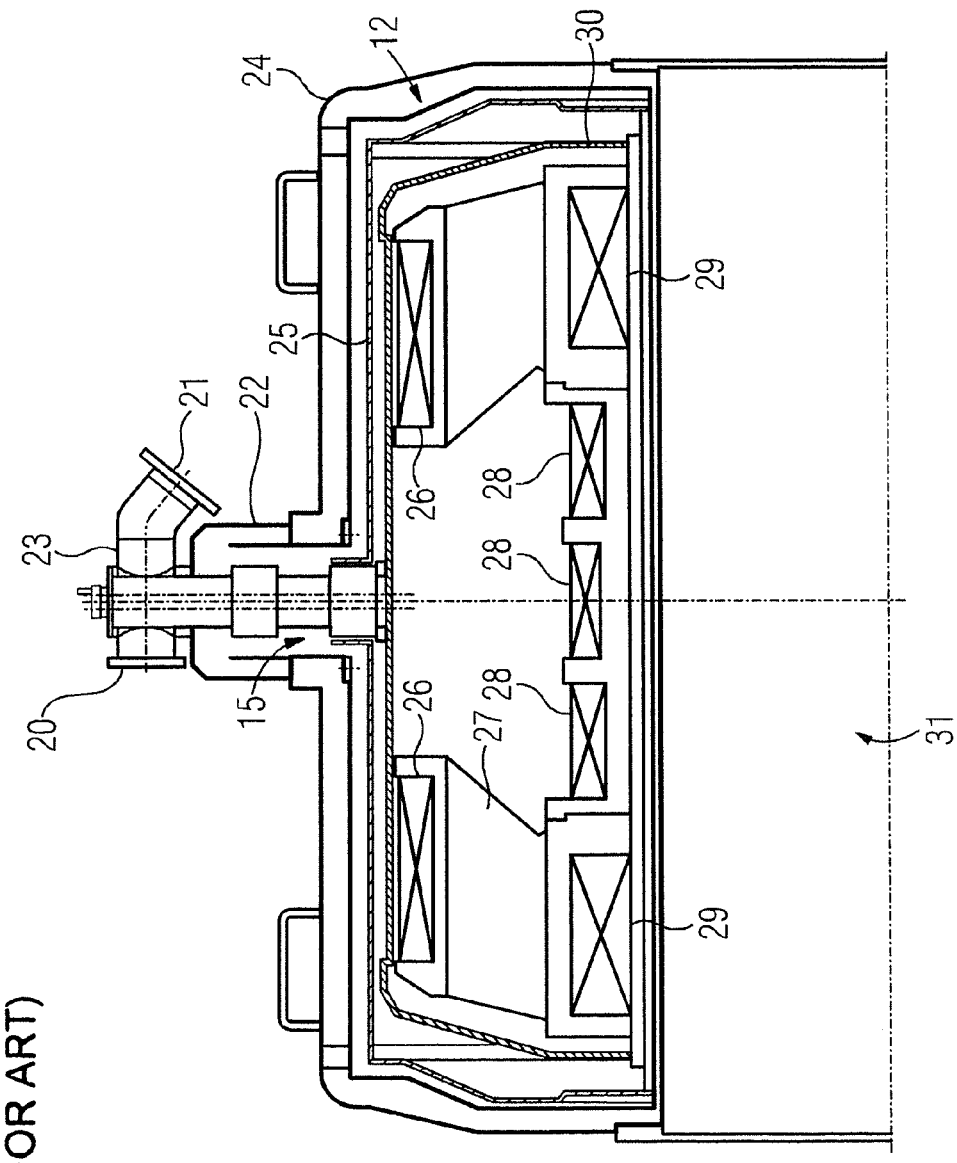
FIG. 1 is a section through a portion of an MR magnet container with a cooling unit according to the prior art.

An assembly for thermal insulation of MR magnets is depicted in FIG. 1 in the form of a cutaway view. The MR magnets are disposed on a spool carrier 27, and designed as coils. At least some of the coils are superconducting. Both shielding coils 26 and base field coils 28 and 29 are depicted. In order to cool the superconducting coils to the necessary low temperatures, these coils are surrounded by a coolant, typically helium. The coolant is located, together with the coils, in a coolant container 30.

Because the coils are supplied with energy during the operation of the MR tomography apparatus, heat is generated during the operation. This causes a heating of the coolant in the coolant container 30. In order to discharge the heat, and to maintain the necessary low temperatures, a cooling unit 23, a so-called "coldhead" is provided. The cooling unit 23 serves to generate cooling energy, or to discharge heat from the coolant container 30 to the exterior. It can be designed in a two-step manner, and have a conventional structure. Coolant gas resulting from heating the coolant can be discharged through venting openings 20, 21 into the environment, in order to prevent excessive pressure in the coolant container 30. The venting openings 20, 21 are sufficiently large enough to ensure a high enough flow rate in the case of an unintentional, abrupt occurrence of large quantities of coolant gas. An unintentional abrupt occurrence of large quantities of coolant gas in this manner can be triggered when the superconducting temperature is exceeded in one of the superconducting coils, which is referred to as a quench, for which reason the venting openings 20, 21 are also referred to as quench pipes.

The coolant container 30 is encompassed by a thermal insulation in the design of an actively cooled thermal shield 25. Optionally, an additional, further shielding foil can be provided between the thermal shield 25 and the outer wall of the container 24. The screening foil can be of a conventional type, e.g. a multi-layered insulating foil (MLI: Multi-Layer-Insulation) can be used. As a further thermal insulation, the container in which the coolant container 30, including the MR coils, is disposed, is designed as a vacuum container 24. It has a double wall in which a vacuum 12 is generated. The container in which the MR coils are disposed encompasses the bore 31 in which an object under examination, or a patient to be examined, respectively, is located during the MR imaging. Moreover, only the upper half of the cross-section of the vacuum container 24, coolant container 30 and coil carrier 27, including the MR coils, is depicted in the image. The container 24, including the components disposed therein, encompasses the bore 31 in a continuous manner, from all sides, and is, in this regard, disposed cylindrically about the bore 31 in the conventional manner. The shape of the container 24, including the components disposed therein, is not, however, significant with respect to the invention explained below.

A cryostat opening 15 is provided in the container 24, through which the cooling unit 23 is disposed, such that it can be brought into contact with the coolant container 30, or the coolant located therein, respectively. The cryostat opening 15 thus serves for the discharge of heat from the coolant container 30 to the environment, and thus represents a heat bridge, or gap, respectively, in the thermal insulation, through the container 24. The cooling unit 23 is installed in a maintenance assembly 22. Typically, the cooling unit 23 is powered by electricity, in order to bring about the discharge of heat from the coolant container 30 into the substantially warmer environment. It is apparent that, when the cooling unit 23 is not functioning, heat can be transferred from the environment through the cooling unit 23, or the cryostat opening 15, to the coolant container 30. In this regard, the cryostat opening 15 comprises a relatively large heat bridge, which results in an undesired substantial heat input, e.g. during transportation.

Figure 2:
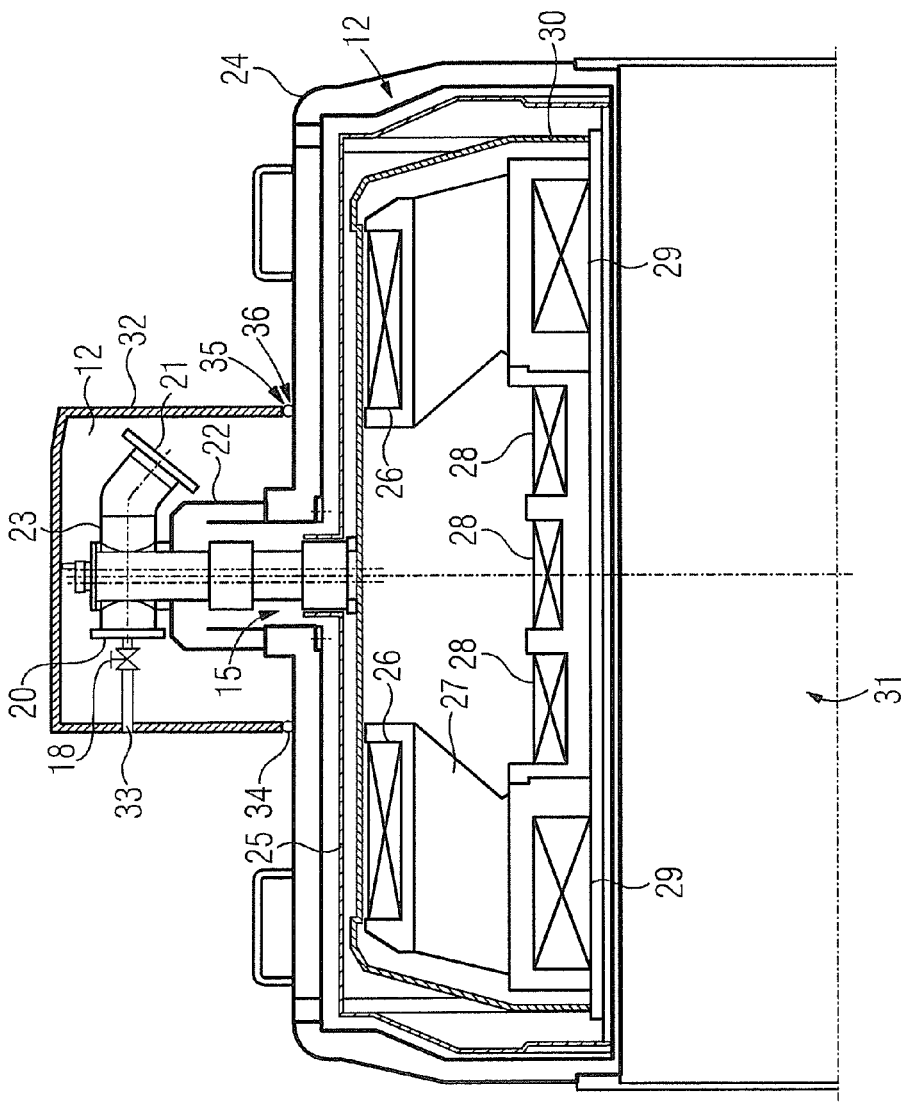
FIG. 2 is a section through a portion of an MR magnet container with a cooling unit and protective cap in accordance with the invention.

The container 24, with the MR coils disposed therein, and including the cooling unit 23, is depicted anew in FIG. 2. Reference is made to the above description regarding the individual components.

In order to prevent an undesired heat input when the cooling unit 23 in the vacuum container 24, or the coolant container 30, is not active, a protective cap is placed over the cryostat opening 15, including the cooling unit 23 disposed therein. The protective cap 32 has a wall that is impermeable to air, the bottom of which has a sealing surface 35 on the side facing toward the container 24, that is placed on a seal 34, which in turn lies on a sealing surface 36 of the container 24. An airtight seal is created by the sealing surfaces 35, 36 and the seal 34 therebetween, between the container 24 and the protective cap 32. For thermal insulation, a vacuum is generated in the space enclosed between the protective cap 32 and the container 24. It is apparent from the depiction that the vacuum 12 encompasses the cryostat opening 15 on all sides, and thus thermally insulates the cryostat opening. Thus, a heat input through the cryostat opening 15 from the environment is prevented or at least limited.

Coolant gas is generated by the nevertheless resulting, slow heating of the coolant in the coolant container 30, despite all of the insulating measures, including the protective cap 32, causing an increase in pressure in the coolant container 30. In order to counteract, or to limit, respectively, this increase in pressure, a venting pipe 33 is provided. The venting pipe 33 is connected at one end to the interior of the coolant container 30, and open at the other end to the environment outside the container 24 and the protective cap 32. The venting pipe 33 is equipped with a pressure valve 18. The pressure valve 18 limits the excess pressure in the coolant container 30 at a predefined level, and allows excess coolant in the gaseous state to escape into the environment. The pressure valve 18 can be provided in addition to an already present venting valve, and allows for a higher pressure than the venting valve in the interior of the coolant container 30. An embodiment without an additional pressure valve of this type, having only quench and venting valves, is also possible.

Because the protective cap 32 is not in place during the operation of the MR tomography apparatus, but instead is used primarily during transportation thereof, there is no reason to anticipate an abrupt increase in pressure in the coolant container 30, e.g. in the case of a quench. In this regard, the quench pipes 20, 21 are not necessary, but rather, the relatively small venting pipe 33 is sufficient. Because of the small diameter of the venting pipe 33, these also represent only a limited heat bridge. Accordingly, they are as small as possible, because they must be in contact with the environment, and thus a heat input from the environment via the walls of the venting pipe 33 cannot be prevented.

In order to further reduce a heat input via the venting pipe 33, this can be designed such that the path for the coolant in the gaseous state flowing through the venting pipe is longer than its external length. In order to obtain the longest possible effective length in this manner, it can, for example, take the shape of a spiral. As a result, a longer dwell time for the vaporizing coolant in the venting pipe 33 is obtained, which in turn results in a better cooling of the pipe.

In order to further reduce a heat input via the venting pipe 33, this can be formed of a material having a low thermal conductivity. For this purpose, aluminum, for example, could be used, which additionally has the advantageous property that with a decrease in temperature, the thermal conductivity decreases further. Other suitable materials are: stainless steel, Inconel, Kevlar or Teflon.

With conventional constructions of the vacuum container 24, including the cooling unit 23 and maintenance assembly 22, an airtight sealed connection between the components is provided, such that the vacuum 12 enclosed by the protective cap 32 is limited to the space between the protective cap 32 and the vacuum container 24, as well as the maintenance assembly 22 and the cooling unit 23. Depending on the construction, a further expansion of the vacuum 12 would be conceivable, which is of no significance to the invention. For the invention, it is only significant that the cryostat opening 15 is fully, or as fully as possible, surrounded by the vacuum 12 against the environment outside the protective cap 32 and the container 24 for the thermal insulation.

Figure 3:
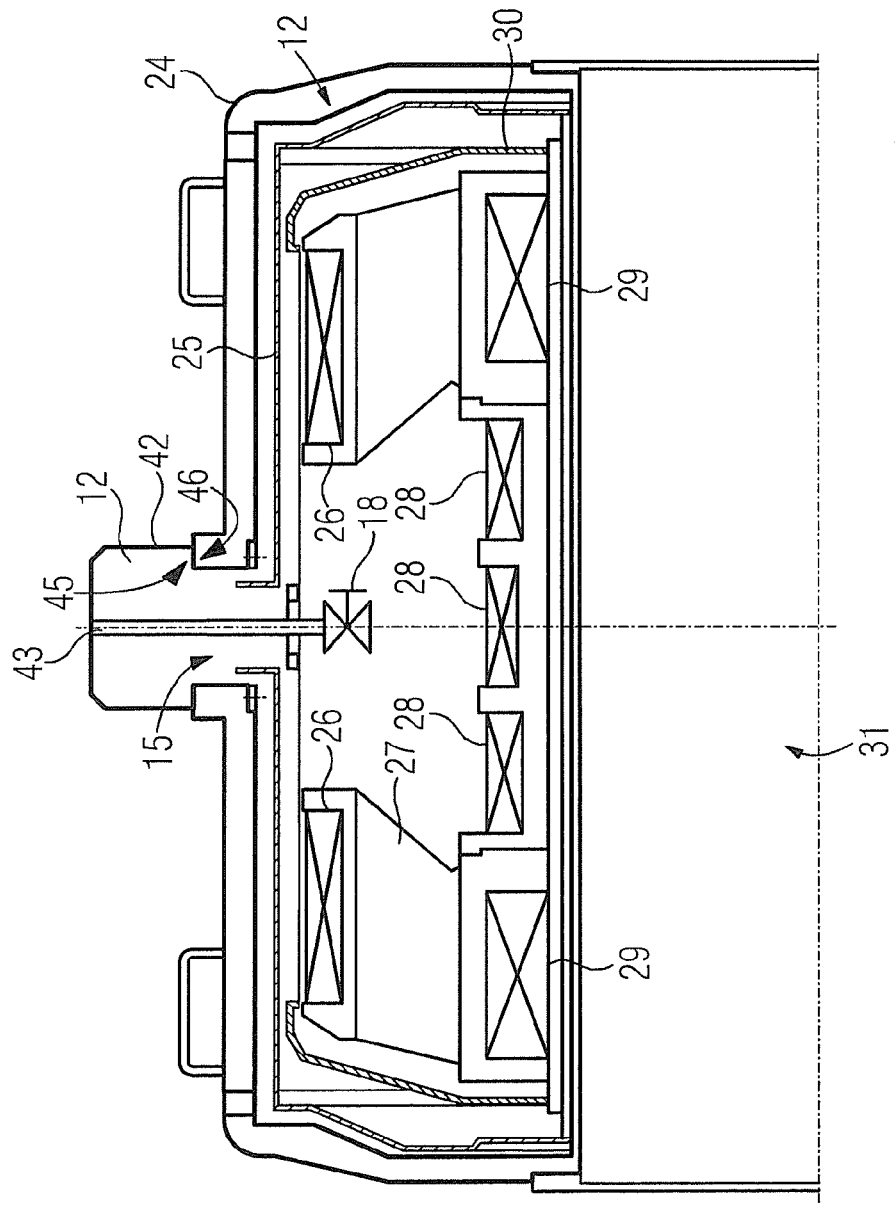
FIG. 3 is a section through a portion of an MR magnet container in accordance with the invention, without a cooling unit and with a protective cap.

The container 24, including the MR coils and other components, is again depicted in FIG. 3. With respect to these components, reference is made to the above description. The depicted embodiment differs with respect to the means for thermal insulation at the cryostat opening 15. In this embodiment, a protective cap 42 is placed in the cryostat opening 15 instead of the cooling unit. The cooling unit itself is removed for this purpose. Because the protective cap 42 is primarily used for transportation purposes, the absence of a cooling unit is not important, since it does not function during transportation.

The protective cap 42 can thus be placed in the cryostat opening 15 in place of a cooling unit, and furthermore is located on the container 24 at a position comparable to the maintenance assembly 22 disposed there. It can be installed either in place of the maintenance assembly 22, or in an alternative embodiment, can be formed by the maintenance assembly 22, which for this purpose must be designed in a suitable manner, and the opening otherwise provided for the cooling unit must then be modified in a corresponding manner, for forming the protective function of the protective cap 42. As an example, the maintenance assembly can be constructed such that it is airtight, or vacuum-tight from the start. In the opening in the maintenance assembly, in which the cooling unit is inserted, a correspondingly designed insert must then be inserted in place of the cooling unit, for transportation purposes. The alternative embodiment, in which the maintenance assembly forms the protective cap 42, is structurally possible without further measures, and in this regard requires no further substantial explanation.

The protective cap 42, whether it is used in place of the maintenance assembly or is formed by the maintenance assembly, encloses, together with the container 24, a space in which a vacuum 12 is generated. For this purpose, the respective corresponding sealing surface 45 of the protective cap 42, and the protective surface 46 of the vacuum container 24 are created such that they correspond to one another, or are connected to one another. In the case of the maintenance assembly, there can be a permanent connection between it and the vacuum container 4. The vacuum 12 serves as the thermal insulation for the cryostat opening 15 with respect to the environment outside the protective cap 42 and the vacuum container 24.

In order to enable the passage of coolant gas, resulting from the heating of the coolant in the coolant container 30, a venting pipe 43 is provided in the protective cap 42, which is connected to the environment at one end, and to the coolant container 30, or the coolant located therein, respectively, at the other end. The venting pipe 43 is equipped with a pressure valve 18, which limits the pressure in the coolant container 30 to a predefined level, and when this level is exceeded, allows coolant to escape. Excess coolant gas escapes into the environment through the pressure valve 18 and the venting pipe 43. The pressure valve 18 can be provided in addition to an already present venting valve, and allow for a higher pressure than the venting valve in the interior of the coolant container 30. An embodiment without an additional pressure valve of this type, having only a quench valve and a venting valve, is also possible.

The venting pipe 43 thus represents a direct connection between the environment and the coolant container 30, which enables an undesired heat input. As explained above, the venting pipe 43 has a relatively small cross-section, such that accordingly, its thermal conductivity is relatively low. In a manner similar to that explained above, the venting pipe 43 can exhibit a greatest possible effective length, e.g. by a spiral-shaped design. In addition, as explained above, it can consist of materials having low thermal conductivity, e.g. aluminum, stainless steel, Inconel, Kevlar, or Teflon. A connection having a low thermal conductivity must be ensured between the protective cap 42, or, if applicable, the maintenance assembly designed as a protective cap, and the cryostat opening 15.

Figure 4:
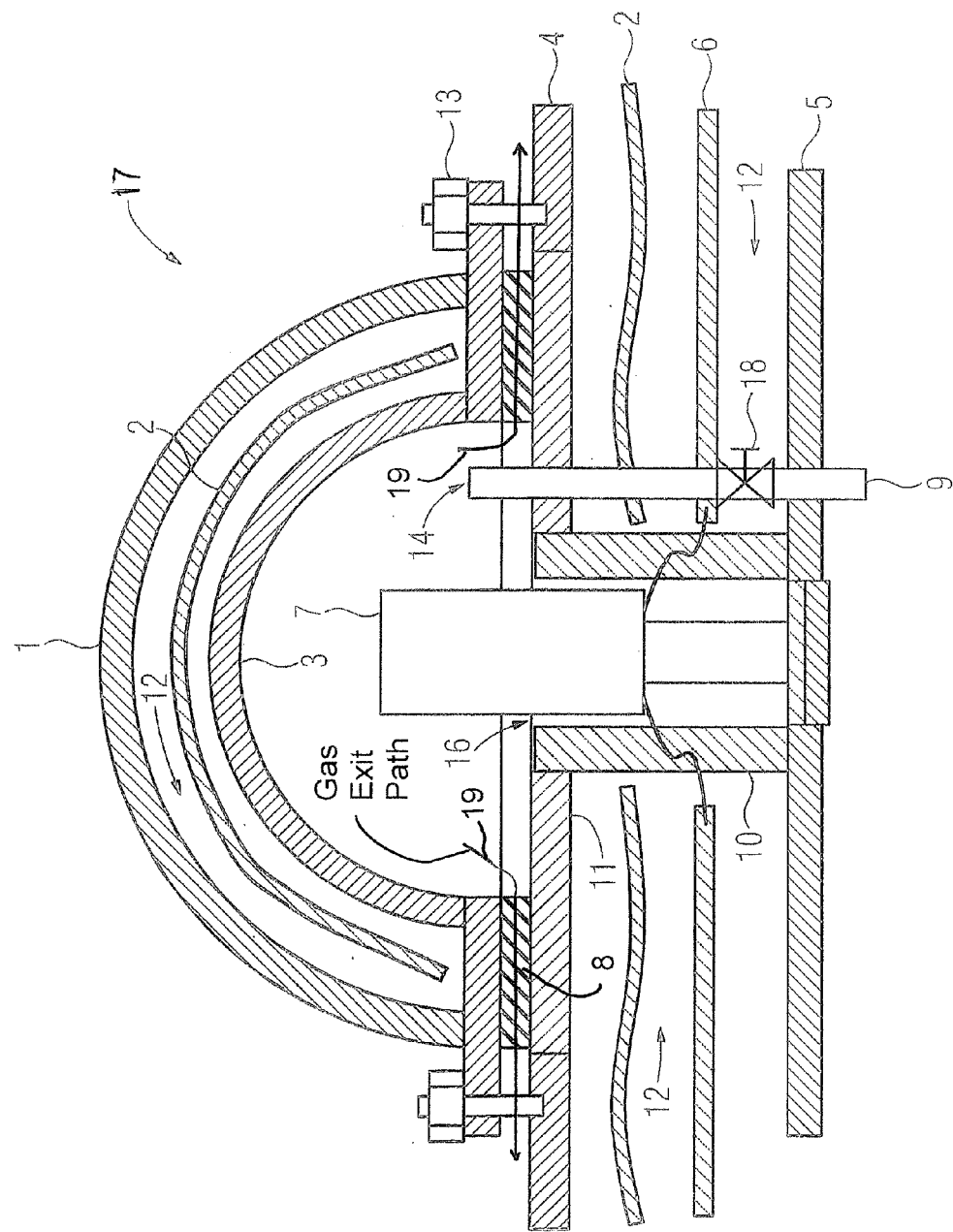
FIG. 4 is a section through a portion of an MR magnet container with a cooling unit and interior cooled with a protective cap in accordance with the invention.

A further embodiment for a protective cap 17 is depicted in FIG. 4. The vacuum container 4, in which the coolant container 5 and the MR coils are disposed, is only shown in part. A depiction of the MR coils is omitted.

The coolant container 5 is encompassed by a thermal shield 6, which in turn is encased in an insulating foil 2. The thermal shield 6 can be actively cooled by the cooling unit 7, which is obtained by means of a connection, depicted as an s-shaped curve in the illustration, made of a material having good thermal conductivity, e.g. copper. The thermal shield 6 and the insulating foil 2 form a doubled thermal insulation inside the vacuum container 4. The vacuum container comprises, as explained above, a vacuum wall, in which a vacuum 12 is generated for a substantial thermal insulation.

A cooling unit 7 is disposed in the cryostat opening 16. The cooling unit 7 is further thermally insulated by insulation means 10, 11, in order to reduce a heat input from the cooling unit 7 into the vacuum container 4, or the coolant container 5, respectively. The insulation means 10, 11 consist, accordingly, of materials having a low thermal conductivity.

The protective cap 17 is placed over the cryostat opening 16, including the cooling unit 7 disposed therein. It consists of a material having a low thermal conductivity. If applicable, it is placed on a maintenance assembly, or otherwise, directly on the vacuum container 4. The protective cap 17 has a double wall, formed by a warm outer wall 1 and a cold inner wall 3. A vacuum 12 is generated within the double wall. In addition, there is an insulating foil 2 located inside the double wall. The insulating foil 2 can be designed as a multi-layered foil (MU), and its position must not necessarily be located inside the double wall. The insulating foil 2 forms a structure, together with the vacuum 12, for thermal insulation, which encompasses the cryostat opening 16, as depicted, and insulates against the environment.

In order to discharge excess coolant gas resulting from heat in a controlled manner, a vent 9 is provided, in which a pressure valve 18 is disposed. The pressure valve 18 allows coolant gas to escape through the vent 9 when a predefined pressure has been reached, which escapes through a venting opening 14 in the space enclosed by the protective cap 17 and the container 4. Because the protective cap 17, as explained above, is primarily used for transportation purposes, and thus an abrupt pressure increase in the coolant container 5, e.g. in the case of a quench, cannot occur, the venting pipe 9 or the venting opening 14 can be designed to be relatively small. Normally, however, it is formed by the quench and venting pipe that is typically provided, in the typical dimensions.

Coolant gas discharged from the venting opening 14 is first located in the space enclosed by the protective cap 17 and the container 4. Because it has a very low temperature with respect to the surrounding temperature, which is only higher than the temperature in the interior of the coolant container 5, it results in a significant cooling of this space and the components disposed therein, and the cold inner wall 3 of the protective cap 17. Of course, the warm outer wall 1 of the protective cap 17, as well as all of the further components having thermal contact thereto are also cooled.

The protective cap 17 is placed on a seal 8, which in turn is placed on the container 4. The seal 8 is designed to firm a gas exit path 19 to allow a passage of coolant gas at a reduced flow rate into the environment outside the protective cap 17 and the vacuum container 4. An excessive pressure increase beneath the protective cap 17 thus is prevented by the passage at a reduced flow rate. Additionally, it is ensured that the coolant gas exiting through the venting opening 14 remains for a certain time beneath the protective cap 17.

The coolant gas remaining under the protective cap 17 cools, as explained above, the protective cap 17 as well as the cooling unit 7 and further components. In this manner, cooling of the cooling unit 7 is obtained, without the need for additional cooling measures, in that only the escaping coolant gas is used for this. The cooled cooling unit 7 obviously results in a lower heat input into the coolant container 5 than would be the case if the cooling unit were not cooled. Furthermore, the material for the protective cap 17 can be selected such that its thermal conductivity decreases when cooled. For this purpose, as an example, aluminum, stainless steel, Inconel, Kevlar or Teflon can be used. This reduction in thermal conductivity occurring, when cooled, in numerous materials, results in an additional increase in the thermal insulation performance of the protective cap 17.

The protective cap 17 is mechanically fixed in place on the vacuum container 4, or, if applicable, on an associated maintenance assembly, in a suitable manner. For this purpose, threaded rods are provided in the depicted embodiment, on which the protective cap 17 is placed, and fixed in place there by means of nuts 13. Alternatively, the affixing of the protective cap 17 onto the vacuum container 4 can also occur by means of other attachment mechanisms, e.g. latches. For this attachment, it is important that it does not enable an excess heat transfer into the vacuum container 4, and it must cause a suitable compression of the seal 8, such that the desired through-flow rate of coolant gas through the seal 8 is ensured. The seal 8 for this purpose can be formed of a cotton-type or other suitable material or, for example, can have a waffle-like or arched, corrugated structure, or it can be formed by a mechanical construction of sealing elements, e.g. panels and baffles.

Although modifications and changes may be suggested by those skilled in the art, it is the intention of the inventor to embody within the patent warranted hereon all changes and modifications as reasonably and properly come within the scope of his contribution to the art.

I claim as my invention:

1. An assembly for thermally insulating a superconducting magnet, comprising:

a container having a container interior in which a superconducting magnet is contained;

said container comprising thermal insulation that thermally insulates said container interior from an exterior of said container;

a cooling unit that is removably mountable to said exterior of said container;

said container having an opening bearing that places said cooling unit, when present, in communication with said container interior to cool said superconducting magnet in said container interior by operation of said cooling unit; and a cap having a cap interior having a size and dimensions allowing said cooling unit, when present, to be accommodated inside said cap, and a seal between said cap and said exterior of said container that reversibly seals said cap to said exterior of said container, and said cap having a cap exterior exposed to ambient air, and said cap comprising thermal insulation that thermally insulates said interior of said cap from said exterior of said cap in order to prevent formation of thermal bridges between said cap interior and said ambient air.

2. An assembly as claimed in claim 1 wherein said cap is placed on said exterior of said container, over said opening, without said cooling unit situated inside said cap.

3. An assembly as claimed in claim 1 wherein said cap is placed on said exterior of said container, over said opening, with said cooling unit situated inside said cap.

4. An assembly as claimed in claim 1 wherein said seal comprises a sealing surface at a bottom of said cap, and a sealing surface on said exterior of said container surrounding said opening, and an intermediate seal situated between said sealing surface of said cap and said sealing surface of said container.

5. An assembly as claimed in claim 1 comprising a cooling system disposed in said container interior, said cooling system comprising a venting conduit that proceeds through said opening bearing, with a pressure valve situated in said venting conduit.

6. An assembly as claimed in claim 5 wherein said venting conduit opens into a space enclosed between said cap and said container.

7. An assembly as claimed in claim 6 wherein said cooling system produces gaseous coolant during operation of said cooling system, and wherein said gaseous coolant is discharged through said venting conduit, at a first flow rate, into said space, and wherein said seal comprises a first sealing surface formed by a bottom edge of said cap, a second sealing surface on said exterior of said container, opposite said first sealing surface, a seal element between said first and second sealing surfaces, and an adjustable attachment that attaches said cap to said exterior of said container and applies a selective adjustable compression to said seal element, thereby producing an exit path that allows said gaseous coolant to exit from said space, through said seal element, at a second flow rate that is less than said first flow rate and that is dependent on a degree of said compression of said seal element.

8. An assembly as claimed in claim 5 wherein said venting conduit comprises a conduit open that is opened to the environment at said exterior of said protective cap and said exterior of said container.

9. An assembly as claimed in claim 8 wherein said venting conduit has an external length, and comprises a path for said gaseous coolant flowing through said venting conduit that is longer than said external length.

10. An assembly as claimed in claim 8 wherein said venting conduit consists of a material having a thermal conductivity that is equal to or less than the thermal conductivity of aluminum.

11. An assembly as claimed in claim 9 wherein said space is evacuated, forming a vacuum therein.

12. An assembly as claimed in claim 1 wherein said thermal insulation of said cap comprises a vacuum insulation.

13. An assembly as claimed in claim 1 wherein said thermal insulation of said cap is a multi-layered insulating foil.

14. An assembly as claimed in claim 7 wherein said first sealing surface is a flange forming said bottom edge of said cap, and wherein said adjustable attachment comprises a plurality of threaded bolts projecting from said exterior of said container through respective holes in said flange, each of said bolts having a nut threaded thereon that is rotatable in order to selectively adjust said compression.

* * * * *